United States Patent
Kuo et al.

(10) Patent No.: US 7,439,751 B2
(45) Date of Patent: Oct. 21, 2008

(54) APPARATUS AND METHOD FOR TESTING CONDUCTIVE BUMPS

(75) Inventors: Yian-Liang Kuo, Hsinchu (TW); Yu-Chang Lin, Hsinchu (TW); Yu-Ting Lin, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/527,696

(22) Filed: Sep. 27, 2006

(65) Prior Publication Data

US 2008/0074130 A1    Mar. 27, 2008

(51) Int. Cl.
    *G01R 31/02* (2006.01)
(52) U.S. Cl. ....................................... 324/754
(58) Field of Classification Search ................. 324/754
     See application file for complete search history.

(56) References Cited

U.S. PATENT DOCUMENTS

| | | | | |
|---|---|---|---|---|
| 3,838,339 A * | 9/1974 | Brandt | | 324/133 |
| 3,944,921 A * | 3/1976 | Tsuda et al. | | 324/133 |
| 4,520,314 A * | 5/1985 | Asch et al. | | 324/762 |
| 4,779,042 A * | 10/1988 | Ugenti et al. | | 714/724 |
| 4,788,488 A * | 11/1988 | Kramer et al. | | 324/678 |
| 5,070,297 A * | 12/1991 | Kwon et al. | | 324/754 |
| 5,736,850 A * | 4/1998 | Legal | | 324/158.1 |
| 5,956,280 A * | 9/1999 | Lawrence | | 365/201 |
| 5,969,530 A * | 10/1999 | Yamashita | | 324/537 |
| 6,815,961 B2 * | 11/2004 | Mok et al. | | 324/754 |
| 6,972,576 B1 * | 12/2005 | Lyons et al. | | 324/699 |
| 7,154,259 B2 * | 12/2006 | Miller | | 324/158.1 |
| 2003/0141883 A1 * | 7/2003 | Mitchell et al. | | 324/754 |
| 2003/0183931 A1 | 10/2003 | Isobe | | |
| 2004/0032271 A1 * | 2/2004 | Blackwood et al. | | 324/754 |
| 2005/0206399 A1 | 9/2005 | Schaeffe | | |
| 2006/0103399 A1 * | 5/2006 | Kuo | | 324/754 |

* cited by examiner

*Primary Examiner*—Ha Nguyen
*Assistant Examiner*—Richard Isla Rodas
(74) *Attorney, Agent, or Firm*—Birch, Stewart, Kolasch & Birch, LLP.

(57) ABSTRACT

An apparatus and method for testing conductive bumps are provided. An exemplary embodiment of a bump testing unit comprises a support substrate with two probes protruding one surface thereof. A digital detecting device is embedded in the support substrate, comprising a first and second input terminals and an output terminal, wherein the input terminals electrically connects one of the probes.

17 Claims, 5 Drawing Sheets

APPARATUS AND METHOD FOR TESTING CONDUCTIVE BUMPS

BACKGROUND OF THE INVENTION

1. Field of the Invention

The present invention relates to device testing techniques and, in particular, to an apparatus for testing conductive bumps and a related testing method.

2. Description of the Related Art

A flip chip microelectronic assembly includes direct electrical connection of face down, or "flipped", electronic components to substrates, such as ceramic substrates, circuit boards, or carriers using conductive bump bonding pads. Flip chip technology is quickly replacing older wire bonding technology that uses face up chips with wire connected to each pad on the chip.

Flip chips are typically made by a process including placing solder bumps on a silicon wafer. The solder bump flip chip processing typically includes four sequential steps of preparing the wafer for solder bumping, forming or placing the solder bumps on the wafer, attaching the solder bumped die to a board, substrate or carrier, and completing the assembly with an adhesive underfill.

The bumps of the flip chip assembly also serve several functions. The bumps provide an electrical conductive path from the chip (or die) to the substrate on which the chip is mounted. A thermally conductive path is also provided by the bumps to carry heat form the chip to the substrate. The bumps also facilitate mechanical mounting of the chip to the substrate.

A few widely used methods of depositing bumps are evaporation, electroplating, electroless plating, sputtering and stencil-printing. The quality of the bumps formed on the semiconductor component, however, is a factor affecting reliability of the semiconductor chip after the flip-chip assembly. Poor bump formation may prevent the semiconductor chip from passing tests, especially reliability tests.

Currently, however, bumps formed on a semiconductor component by one of the described methods can only be tested after the flip-chip assembly of the semiconductor component is completed.

FIGS. 1 and 2 illustrate a conventional "daisy-chain" method testing method, for determining quality of conductive bumps. In FIG. 1, the daisy-chain method is achieved by first forming a bump array having a plurality of bumps 12 over a test die 10 of a semiconductor substrate (not shown) by any of the previously described bump forming methods. Every two bumps 12 are electrically connected by a segment 14 formed on the surface of the test die 10 to form a bump section 16. Each segment 14 is electrically conductive and a plurality of bump sections 16 can thus be formed over the test die 10 and each thereof is electrically separated. Further, second segment 18 can be formed over the test die 10 to properly connect two bump segments 16 for the purpose of line routing. The segment 14 and the second segment 18 can be a short metal segment or a bonding pad formed on the surface of the test die 10, the material thereof can be an electrically conductive material such as aluminum or aluminum alloy.

As shown in FIG. 2, the test die 10 having a plurality of bump sections 16 in FIG. 1 is then assembled on a test board 20 having a plurality of third segments 22 and solder balls 24 formed thereon. The third segment 22 and the solder balls 24 are also electrically conductive. Each bump section 16 on the test die 10 is disposed over a position complementary to a pair of adjacent third segments 22 thereof, and thus, a single electrically conductive path (not shown) can be formed after the assembly of the test die 10. The test board 20 and a test such as an impedance test for the bumps 12 can then be performed by a testing apparatus such as a burn-in socket to examine not only the quality of bumps but also the conditions of the bumping process. The conventional daisy-chain method, however, labor intensive and time consuming. Further, the daisy-chain method cannot be applied to the testing of product dies in modern IC industries and is used only when evaluating a bumping process and process parameters thereof.

Hence, there is a need for an apparatus for instantaneously testing conductive bumps.

BRIEF SUMMARY OF THE INVENTION

An apparatus and method for testing conductive bumps are provided. An exemplary embodiment of a bump testing unit comprises a support substrate with at least two probes protruding from one surface thereof. A digital detecting device is embedded in the support substrate, comprising a first and second input terminals and an output terminal, wherein the input terminals electrically connect one of the probes.

An exemplary embodiment of an apparatus for testing a plurality of conductive bumps comprises a support substrate formed with a plurality of probes protruding one surface thereof. A plurality of digital detecting devices are embedded in the support substrate, each comprising a first and second input terminals and an output terminal, wherein each of the first input terminals electrically connect one of the probes and the output terminal of a previous digital testing device connects the second input terminals of a following digital testing device.

An exemplary embodiment of a method for testing a plurality of conductive bumps comprises the steps of providing a substrate with a region having a plurality of bumps, wherein every two bumps are electrically connected by a conductive section embedded in the substrate, forming a plurality of bump sections. The above apparatus is provided, wherein each of the digital detecting devices respectively opposes one of the bump sections, each having two probes corresponding thereto. The probes of the apparatus are contacted with the bumps to form a conductive pathway between one of the bump sections and each of the digital test devices connected thereto by the probes connecting therebetween. A test signal is provided to each of the probes not connected with the first input terminal and passes each conductive pathway, thereby testing the bumps and providing each of the digital testing devices a first input signal and the first input signal is recorded a test data by each of the digital testing devices. A second input signal is provided to each of the digital testing devices by the second circuit, thereby reading out the test data recorded by each of the digital testing devices and obtain a data sequence.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Apparatus and method for testing conductive bumps will now be described here in greater detail. Some embodiments of the invention, such as the exemplary embodiments described, can potentially test a plurality of conductive bumps formed on a semiconductor component at a wafer level. In some embodiments, this can be accomplished by electrically connecting an apparatus having serially connected digital test devices, each connecting two test probes, with the conductive bumps formed on the semiconductor component to thereby obtain a bump test result through operations of the digital detecting devices.

Figure 1:
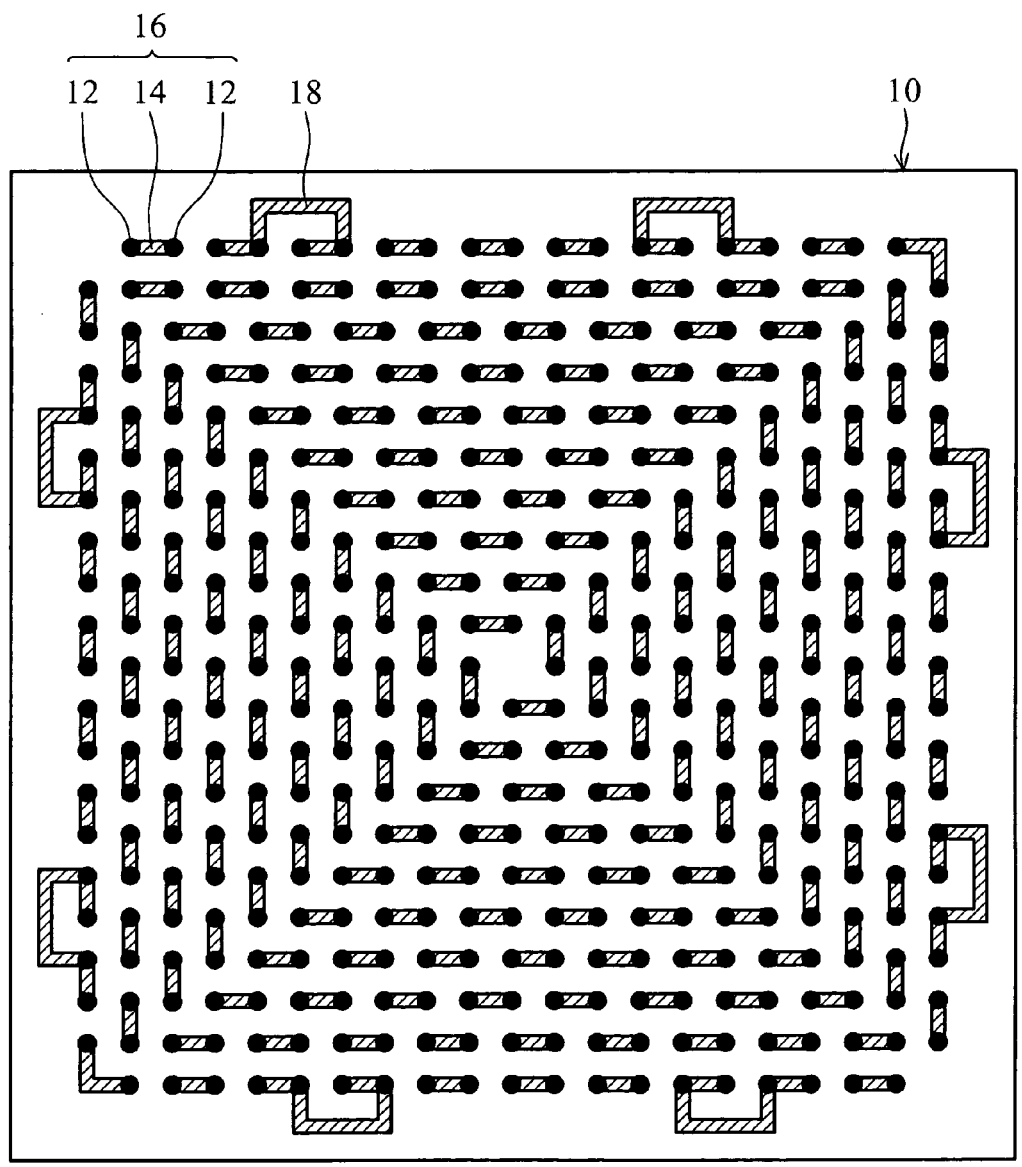
FIGS. 1 to 2 are schematic diagrams of a conventional method for testing conductive bumps.
Figure 2:
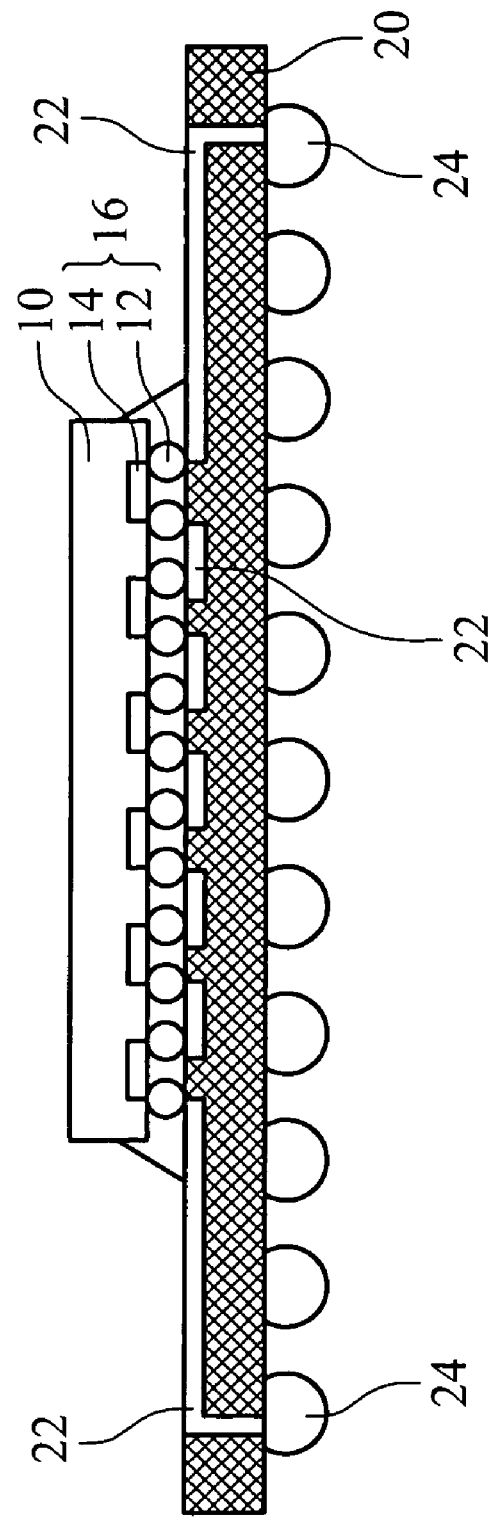
Figure 3:
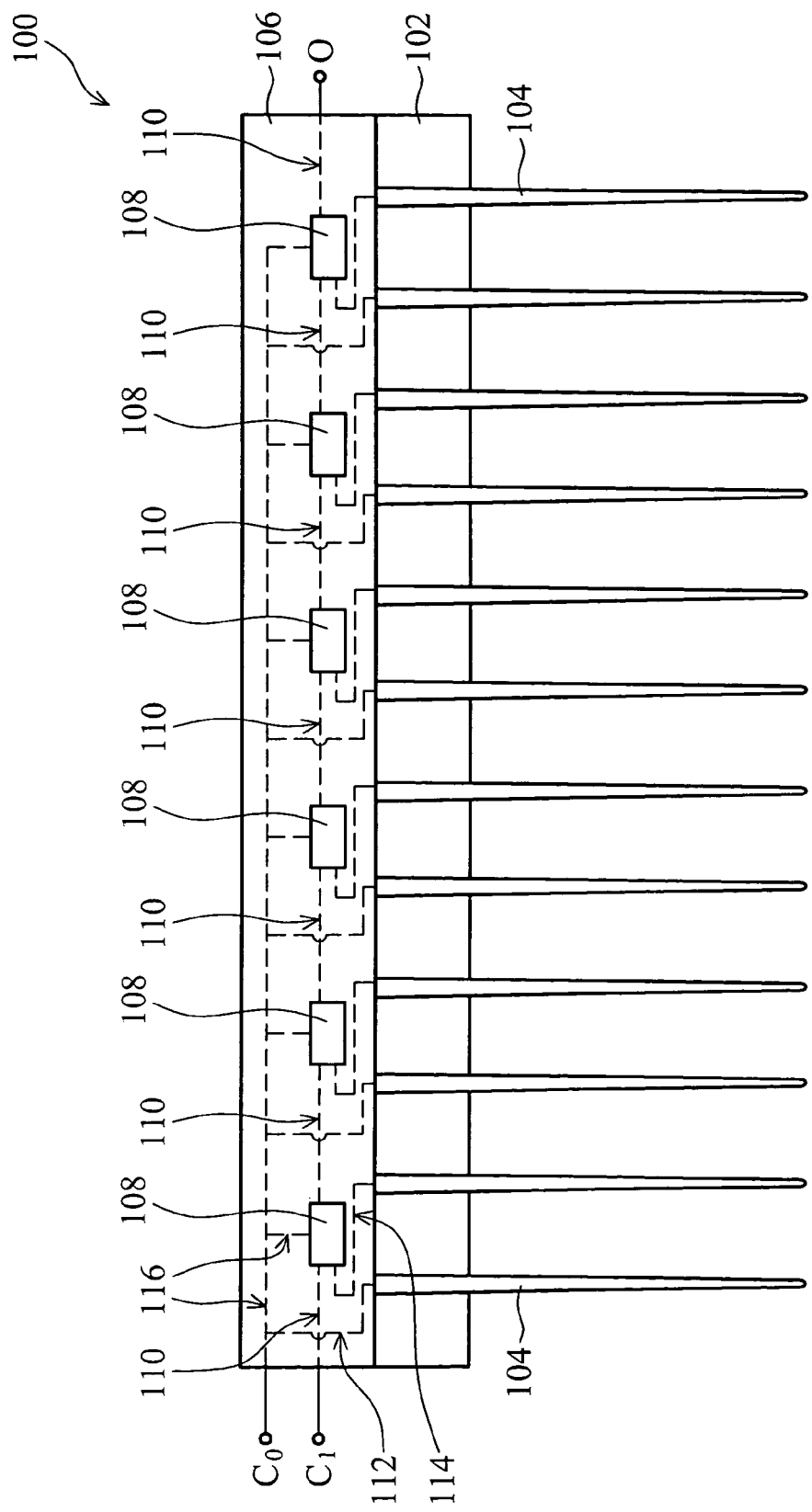
FIG. 3 is a schematic diagram showing a cross section of an apparatus for testing conductive bumps according to an embodiment of the invention.
Figure 4:
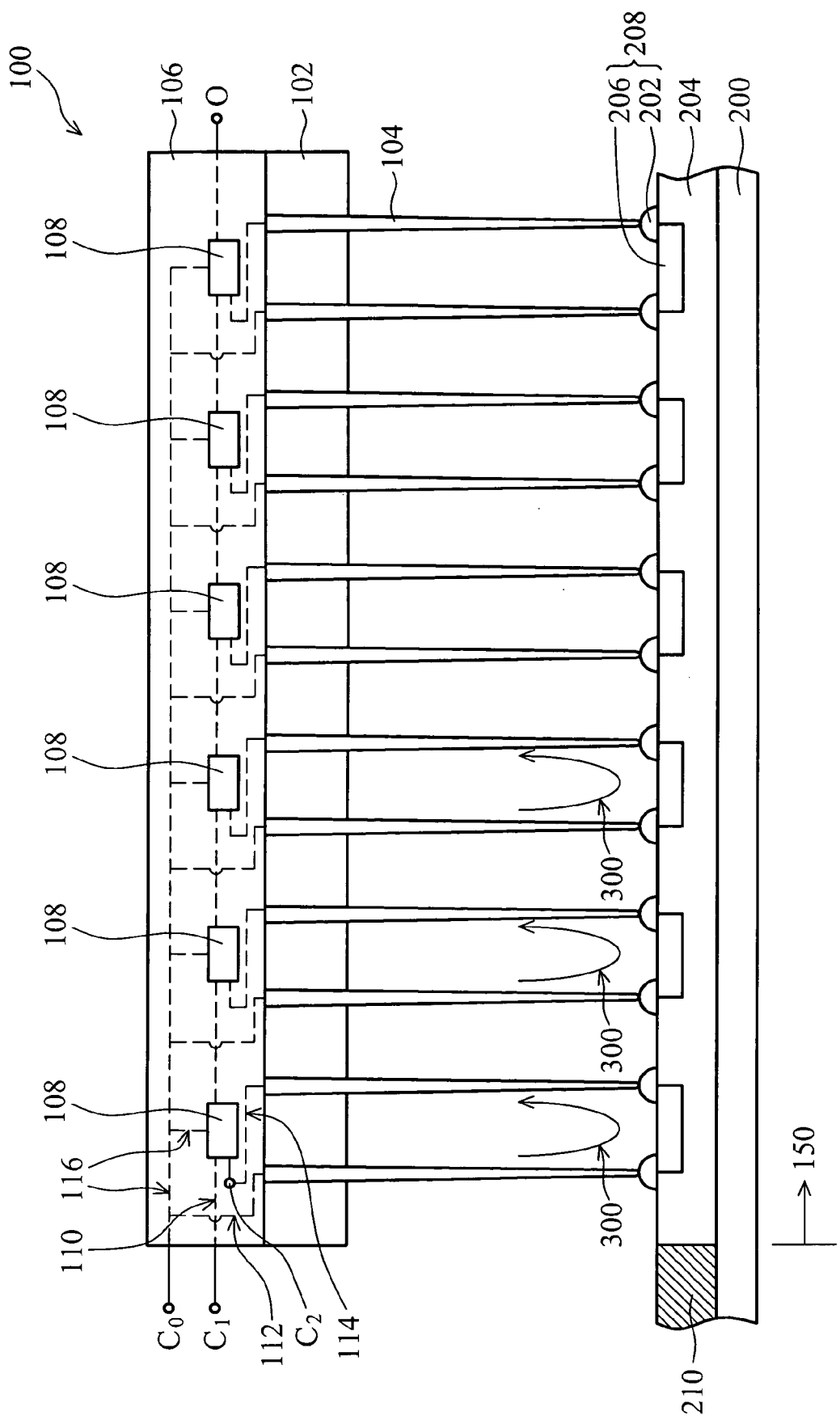
FIG. 4 is a schematic diagram showing a bump test using the apparatus of FIG. 3.
Figure 5:
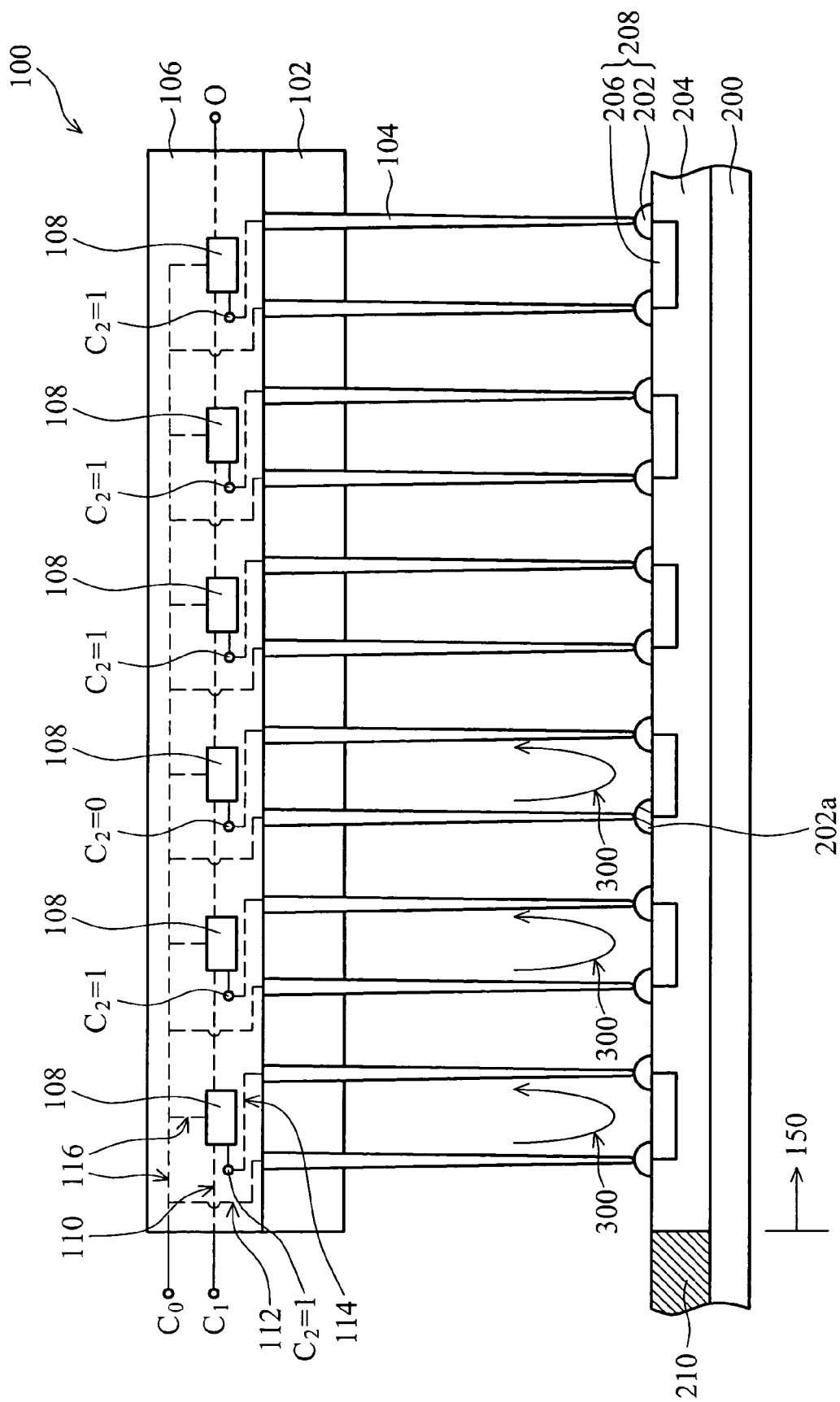
FIG. 5 is a schematic diagram showing data reading after testing conductive bumps using the apparatus of FIG. 3.

FIGS. 3, 4, and 5 are schematic diagrams of various embodiments of an apparatus for testing conductive bumps and bump test methods using the same.

In FIG. 3, an apparatus 100 for testing conductive bumps is illustrated. The apparatus 100 includes a first substrate 102 having a plurality of test probes 104 formed therein, each protruding one surface thereof. Herein, the first substrate 102 can comprise insulating material, such as ceramic, epoxy, resin, polyimide, FR4 or polymer. The test probes 104, can be, for example, tungsten rhenium (WRe) needles, tungsten (W) needles, Beryllium-Copper (BeCu) needles or Peliney® needles and are electrically isolated from each other by the first substrate 102.

The apparatus 100 further includes a second substrate 106 having a plurality of digital testing devices 108 embedded therein. Herein, the digital testing devices 108 can be, for example, flip-flops capable of writing and reading test data, are serially connected by a circuit 110 formed in the second substrate 106. The circuit 110 connects an output terminal (not shown) of a previous digital testing device and an input terminal (not shown) of a following digital testing device. The circuit 110 is also used to connect a input terminal $C_1$ with an input terminal of the front-most digital testing device 108 and a result output terminal O of the most-rear digital testing device 108.

Still referring to FIG. 3, a plurality of circuits 112 and 114 are also formed in the second substrate 106. Each of the circuits 112 respectively connect the first circuit 110 with one of the test probes 104 and each of the circuits 114 respectively connects each of the digital testing device 108 with one of the test probes 104 not connected to the second circuit 112. A circuit 116 is also formed in the second substrate 106 to connect an input terminal (not shown) of each of the digital detecting devices 108 with another input terminal $C_0$ and the circuits 112.

As shown in FIG. 3, the second substrate 106 is stacked on the first substrate 102, thereby forming an integrated probe card. Connections between the circuits 112 and 114, and the test probes 104 can be formed by a conductive wire of a conductive bump (not shown). Also, the second substrate 106 can be formed at a distance from the first substrate 102 (not shown) and is not intended to be limited to the installation shown in FIG. 3. Installation of the second substrate 106 and the first substrate 102 forming the apparatus 100 can be properly modified by those skilled in the art.

Referring now to FIG. 4, a cross section showing the apparatus 100 of FIG. 3 corresponding to a test region 150 formed over a semiconductor substrate 200 for bump testing is illustrated. The arrangement of the test probes 104 and the digital testing devices depicted in FIG. 4, however, is not intended to be limitative, and the installation shown in FIG. 4 can be properly modified by those skilled in the art according to the relative bump arrangement.

As shown in FIG. 4, a plurality of bumps 202 is formed on the surface of an insulating layer 204 overlying the semiconductor substrate 200. The apparatus 100 is disposed over a test region 150 having a bump array comprising a plurality of bumps 202 formed thereon for the purpose of performing a bump test. The test region 150 can be a periphery region of a product die or a test die formed on a semiconductor substrate 200, divided by a dummy region 210. Bumps 202 can be formed by methods such as evaporation, electroplating, electroless plating, sputtering or stencil-printing.

Still referring to FIG. 4, every two bumps 202 are respectively connected by a conductive segment 206 formed in the insulating layer 204, thus, a plurality of bump sections 208 is formed in the test region 150. The bump sections 208 are electrically independent and respectively spaced by the insulating layer 204. Herein, the conductive segment 206 can be a short metal segment or a conductive bonding pad of conductive material such as aluminum or aluminum alloy.

During the bump test, the apparatus 100 is moved toward the semiconductor 200 by a handler (not shown) such that all the probes can simultaneously contact all the bumps 202 formed in the test region 150, wherein test probes 104 respectively contacts a bump formed over each bump sections 208 through physical contacts. An electrical conductive pathway 300 is thus formed between one of the bump sections 208 and each of the digital test devices 108 connected thereto by two test probes 104.

Thus, during the bump test, the bumps 202 formed over the semiconductor substrate 200 can be tested by first providing the circuit 112 a test signal_at relative high level, e.g. above 3.3 Volts, from the input terminal $C_0$. Therefore, each of the digital detecting devices 110 can simultaneously receive an input signal (titled as $C_2$ here) from the electrical conductive pathway 300 and the input signal is converted into a test data and then recorded by each of the digital detecting devices 110. Once the input voltage received by each of the digital detecting devices 110 is at a relatively high level, a test data "1" will be recorded thereby, representing the corresponding bump section thereto is formed without malfunctioning bumps. On the contrary, once the input voltage received by each of the digital detecting devices 110 shows a lower level than that of the input voltage, a test data "0" will be recorded by thereof, representing the bump section corresponding thereto is formed with malfunctioning bumps.

Next, the circuit 10 is provided with a voltage signal at a relative low voltage level, e.g. below 3.3 Volts, from the input terminal $C_1$. The test data recorded in each of the digital detecting devices 10 is squeezed out and are then read out, thereby obtaining a data sequence in FIFO (first-in-first-out) sequence at the output terminal O.

Optionally, a set signal can be previously provided to each of the digital detecting devices 110 at a voltage signal at a relative low voltage level, e.g. below 3.3 Volts, from the input terminal $C_0$ before contacting the apparatus 100 with the bumps 202 formed on the surface over the semiconductor substrate 200 to erase memory states of all the digital detecting devices 110.

FIG. 5 shows a schematic diagram showing data reading after testing conductive bumps using the apparatus of FIG. 3, wherein six set of bump sections 208 are provided and a malfunction bump 202 is provided in one thereof. According to the above testing procedures, each of the digital detecting devices 110 simultaneously receive the input signal $C_2$ from the electrical conductive pathway 300 and the signal $C_2$ is converted into a test data and then recorded by each of the digital detecting devices 110. Due to formation of the malfunction bump 202a, the corresponding digital testing device 110 thereto receives an input signal $C_2$ at relative low voltage level and is recorded as a test data "0" here and other digital detecting devices 10 corresponding to normal bumps receives an input signal $C_2$ at relative high voltage level and is recorded as a test data "1". Next, the circuit 110 is provided with a voltage signal at a relative low voltage level, e.g. below 3.3 Volts, from the input terminal $C_1$. The test data recorded in each of the digital detecting devices 110 is sequentially squeezed out and are then read out, thereby obtaining a data sequence "110111" in FIFO (first-in-first-out) sequence at the output terminal O.

Thus, conductive bumps can be tested at a wafer level and bumping information such as numbers and/or locations of the malfunction bumps formed can be instantaneously obtained. Other defect distribution analysis and the like for evaluating conductive bumps can thus be performed immediately after bump formation by the apparatus 100. If the data sequence obtained form the serially connected digital detecting devices shows an acceptable result that meets the specifications of the wafer level test, bump quality or bumping process condition are ensured. If the data sequence obtained from the serially connected digital detecting devices shows an unacceptable result, the bumping process may be suspended and inspection of the malfunction bumps over the test die or the product can be sequentially performed.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A bump testing unit for testing a plurality of conductive bumps comprising:
    a support substrate with at least two probes protruding from one surface thereof, for contacting the conductive bumps;
    a digital testing device embedded in the support substrate, comprising a first and second input terminals and an output terminal, wherein the first input terminal is electrically connected to one of the probes; and
    a first circuit formed in the support substrate to electrically connect a third input terminal of the digital testing device and the probe not connected with the first input terminal, for providing the digital testing device with a set signal or providing the probe not connected to the first input terminal with a test signal,
    wherein the digital testing device is a flip-flop.

2. The bump testing unit as claimed in claim 1, wherein the support substrate comprises ceramic, epoxy, resin, polyimide, $FR_4$ or polymer.

3. The bump testing unit as claimed in claim 1, wherein the probes comprise tungsten rhenium (WRe), tungsten, Beryllium-Copper (BeCu) or Peliney®.

4. The bump testing unit as claimed in claim 1, wherein the probes are electrically isolated from each other by the support substrate.

5. The bump testing unit as claimed in claim 1, further comprising a second circuit formed in the support substrate to electrical connecting the second input terminal of the digital testing device, for providing the digital testing device with a first input signal.

6. The bump testing unit as claimed in claim 1, further comprising a third circuit formed in the support substrate, being electrically connected to the first input terminal of the digital testing device and the probe electrically connected thereto, for providing the digital testing device with a second signal.

7. An apparatus for instantaneously testing a plurality of conductive bumps, comprising:
    a support substrate formed with a plurality of probes protruding one surface thereof, for contacting the conductive bumps; and
    a plurality of digital testing devices embedded in the support substrate, each comprising a first and second input terminals and an output terminal, wherein each of the first input terminals is electrically connected to a separate probe among the plurality of probes and the output terminal of a previous digital testing device among the plurality of digital testing devices is connected to the second input terminal of a following digital testing device adjacent thereto among the plurality of digital testing devices; and
    a first circuit formed in the support substrate respectively connected to a third input terminal of each of the digital testing devices and electrically connected to the probes not connected with the first input terminal, for providing a set signal to each of the digital testing devices or providing a test signal with each of the probes not connected with the first input terminal.

8. The apparatus as claimed in claim 7, wherein the support substrate comprises ceramic, epoxy, resin, polyimide, FR4 or polymer.

9. The apparatus as claimed in claim 7, wherein the probes comprise tungsten rhenium (WRe), tungsten, Beryllium-Copper (BeCu) or Peliney®.

10. The apparatus as claimed in claim 7, wherein the probes are electrically isolated from each other.

11. The apparatus as claimed in claim 7, further comprising a second circuit formed in the support substrate to electrically connect the second input terminal of each of the digital testing devices, for providing each of the digital testing devices with a first input signal.

12. The apparatus as claimed in claim 7, further comprising a third circuit formed in the support substrate, electrically connecting the first input terminal of each of the digital testing devices and the probe electrically connected thereto, for providing each of the digital testing devices a second input signal.

13. The apparatus as claimed in claim 7, wherein the digital testing devices are flip-flops.

14. A method for testing conductive bumps, comprising the steps of:
    providing a substrate with a region having a plurality of bumps, wherein every two bumps are electrically connected by a conductive section embedded in the substrate, forming a plurality of bump sections;
    providing the apparatus of claim 7, wherein each of the digital testing devices respectively opposes one of the bump sections, each having two probes corresponding thereto;

contacting the probes of the apparatus with the bumps to form a conductive pathway between one of the bump sections and each of the digital testing devices connected thereto by the probes forming a connection;

providing a test signal to each of the probes not connected with the first input terminal and passes each conductive pathway, thereby testing the bumps and providing each of the digital testing devices a first input signal and the first input signal is recorded a test data by each of the digital testing devices; and providing a second input signal to each of the digital testing devices by the second circuit, thereby reading out the test data recorded by each of the digital testing devices and obtain a data sequence.

15. The method as claimed in claim 14, wherein the second input signal squeezes out the test data recorded in each of the digital testing devices to thereby obtain a data sequence.

16. The method as claimed in claim 15, wherein the test signal is provided at a relative high voltage level and the first input signal recorded as the test data by each of the digital testing devices shows a relative high voltage level while the conductive pathway formed between one of the bump sections and each of the digital test devices connected thereto is normal but shows a relative low voltage level while malfunction bumps are existed in the corresponding bump section.

17. The method as claimed in claim 14, wherein data sequence is obtained in FIFO (first-in-first-out) sequence.

* * * * *